United States Patent [19]

Ohashi

[11] Patent Number: 5,191,281

[45] Date of Patent: Mar. 2, 1993

[54] IC TESTER CAPABLE OF CHANGING STROBE POSITION IN ACCORDANCE WITH A PREDETERMINED REFERENCE SIGNAL

[75] Inventor: Kazuhiko Ohashi, Tokyo, Japan

[73] Assignee: Kabushiki Kaisha Toshiba, Kawasaki, Japan

[21] Appl. No.: 747,627

[22] Filed: Aug. 20, 1991

[30] Foreign Application Priority Data

Aug. 21, 1990 [JP] Japan .................................. 2-218102

[51] Int. Cl.$^5$ .............................................. G01R 31/28
[52] U.S. Cl. ................................. 324/158 R; 324/73.1; 371/25.1; 371/15.1
[58] Field of Search ........................... 324/158 R, 73.1; 371/22.1, 15.1, 22.2, 27, 25.1, 22.4; 437/8

[56] References Cited

U.S. PATENT DOCUMENTS

| | | | |
|---|---|---|---|
| 4,761,607 | 8/1988 | Shiragasawa et al. | 324/158 R |
| 4,774,460 | 9/1988 | Todokoro et al. | 324/158 R |
| 4,775,977 | 10/1988 | Dehara | 371/25.1 |
| 4,965,511 | 10/1990 | Nishimura et al. | 324/158 R |
| 5,029,168 | 7/1991 | Chan | 324/73.1 |

*Primary Examiner*—Vinh Nguyen
*Attorney, Agent, or Firm*—Foley & Lardner

[57] ABSTRACT

An IC tester correctly carries out a function test on an integrated circuit (IC). The IC tester selects one of two strobe position signals depending on whether an expected value is for testing a rise or a fall of an output signal of the tested IC, and compares the expected value with the output signal at a proper timing specified by the selected strobe position signal. The IC tester avoids an error of test due to a deviation between the positions of the rise and fall of the output signal of the tested IC.

7 Claims, 5 Drawing Sheets

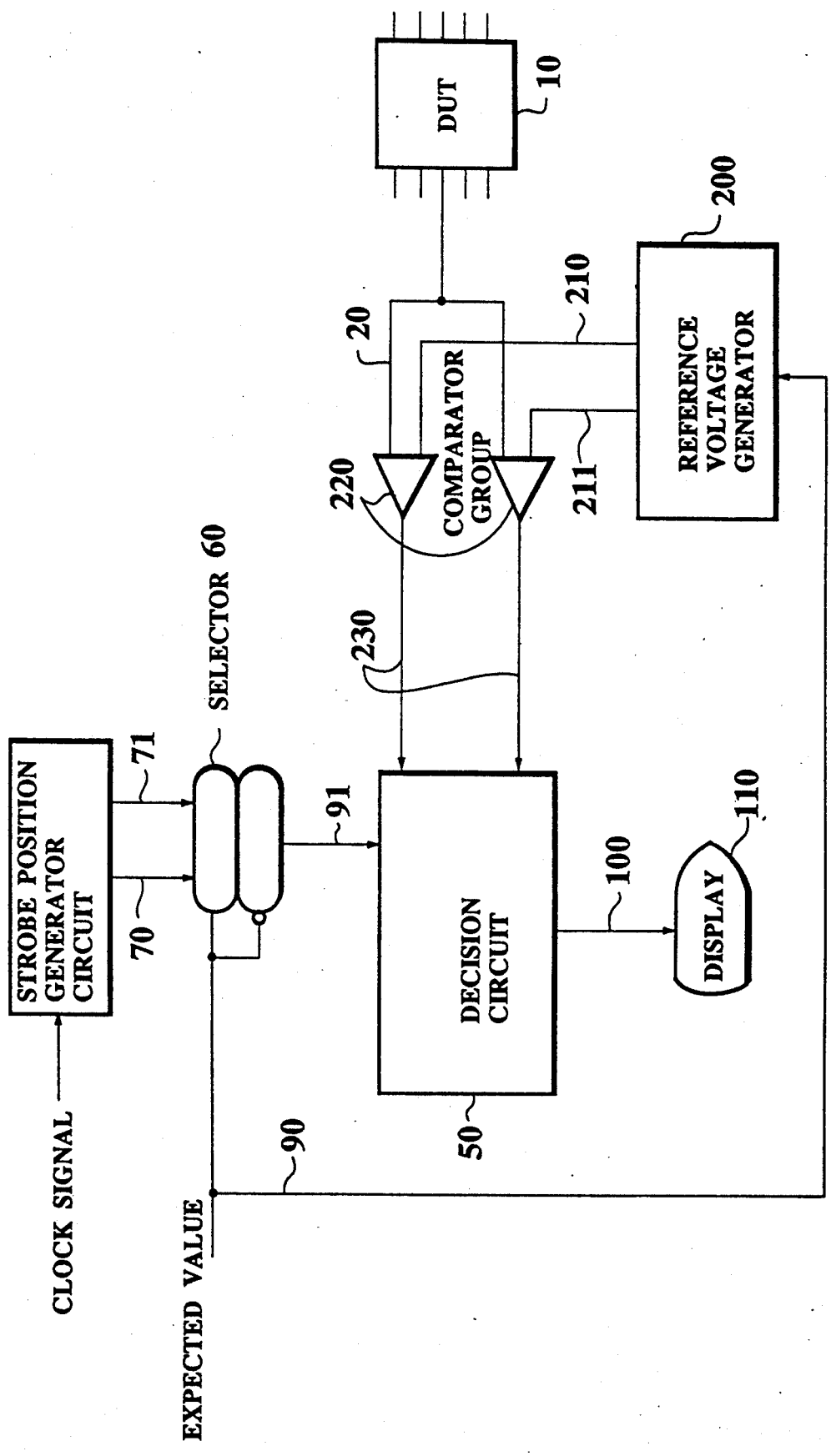

IC TESTER CAPABLE OF CHANGING STROBE POSITION IN ACCORDANCE WITH A PREDETERMINED REFERENCE SIGNAL

BACKGROUND OF THE INVENTION

1. Field of the Invention

The present invention relates to an IC tester for testing an integrated circuit (IC), and particularly to an IC tester that efficiently tests an integrated circuit whose output signal rises and falls at different timing.

2. Description of the Prior Art

Internal circuits of some integrated circuits (ICs) operate in synchronism with clock signals. These ICs are called clock synchronous ICs. Among them, some involve output and input signals that are also synchronous with the clock signals. The clock synchronous ICs are classified into two kinds. One operates in synchronism with a rise of the clock signals, and the other with a fall of the clock signal.

These ICs are usually tested with an IC tester. The test is generally classified into a function test, an AC characteristic test, and a DC characteristic test. The function test of the clock synchronous IC is carried out on each pin of the IC at a predetermined timing by comparing an expected value prepared for every clock cycle with an output signal from the pin of the IC. An ordinary IC provides two or three output values, i.e., a high level value and a low level value, or in addition to them, a high impedance value.

A conventional IC tester for testing the clock synchronous IC that provides two output levels will be explained with reference to FIGS. 1 and 2.

FIG. 1 is a block diagram showing the conventional IC tester involving an IC to be tested (DUT, device under test) 10, a signal line 20, a voltmeter 30, a signal line 40, a decision circuit 50 for determining a pass or a fail in the test, a signal line 70 for indicating a timing (hereinafter referred to as a strobe position) for comparing a tested output of the DUT 10 with an expected value, a signal line 80 for transferring the expected value, a signal line 100 for transferring a result of the decision circuit 50, and an indicator 110 for displaying the output of the decision circuit 50 to show an agreement or a disagreement of the tested output with the expected value.

The output of the DUT 10 is supplied to the voltmeter 30 through the signal line 20. The voltmeter 30 measures the voltage of the output and provides the measured result to the decision circuit 50 through the signal line 40. The decision circuit 50 receives the output of the voltmeter 30, a strobe position through the signal line 70, and the expected value (a high level value or a low level value) as well as voltage information corresponding to the expected value through the signal line 80. The decision circuit 50 compares the output of the voltmeter 30 with the expected value (a reference voltage) provided through the signal line 80 at the strobe position provided through the signal line 70, and determines a pass or a fail. Thereafter, the decision circuit 50 provides a result of the decision to the indicator 110 through the signal line 100, so that the indicator 110 may display the result.

FIG. 2 shows changes in the output signal of the DUT 10 and timing relations between the output signal and the clock signal. A fall of the output signal of the DUT 10 is in synchronism with a fall of the clock signal, and a rise of the output signal is in synchronism with a rise of the clock signal.

The conventional IC tester can allocate only one kind of strobe positions. When the strobe positions are set as indicated with white triangles in FIG. 2, expected values at the respective strobe positions will be H, H, L, H, and H. When the strobe positions are set as indicated with black triangles, expected values at the respective strobe positions will be H, L, L, H, and H.

As shown in FIG. 2, the output signal of the DUT 10 falls to a low level in the latter half of a second period of the clock signal. At this moment, the expected value at the strobe position of the white triangle is H. Accordingly, the low level of the output signal is first detected in a third period of the clock signal.

Even if the output signal of the DUT 10 does not fall to the low level in the latter half of the second period of the clock signal due to a malfunction of the DUT 10, the DUT 10 may be determined to be normally operating if the output signal of the DUT 10 falls to the low level before the first half of the third period of the clock signal as indicated with a dotted line "a". In this case, therefore, it is preferable to shift the strobe position to the latter half of each period of the clock signal as indicated with the black triangles.

This shift is not preferable, however, when the output signal rises at a fourth period of the clock signal. Even if the output signal delays to rise due to some abnormality as indicated with a dotted line "b", this abnormality will not be distinguished from a normal operation.

In this way, the conventional IC tester hardly determines in one time of operation whether or not the output signal of the DUT 10 rises and falls at a prescribed timing, and must test the output signal twice by changing the expected values and strobe positions.

These problems of the conventional IC tester happen not only in testing the clock synchronous ICs explained above but also in testing clock asynchronous ICs.

In this way, when testing ICs involving an output signal that rises and falls at different timing, the conventional IC tester uses a common strobe position both for the rises and the falls of the output signal, so that two different test patterns must be prepared one for the rises and the other for the falls. This greatly deteriorates the efficiency of IC testing.

SUMMARY OF THE INVENTION

An object of the present invention is to provide an IC tester that correctly carries out a function test on an integrated circuit (IC).

Another object of the present invention is to provide an IC tester that compares, when carrying out a function test on an IC, an expected value with an output signal of the IC at a proper strobe position that is determined according to a rise or a fall of the output signal of the IC to be tested.

In order to accomplish the objects, the present invention provides an IC tester comprising a strobe signal output circuit for providing a strobe signal indicating a strobe position at which an output signal of a tested circuit is compared with an expected value, and a comparison and decision circuit for receiving the output signal with the tested circuit, the expected value, and the strobe signal from the strobe signal output circuit, and comparing the output signal with the expected value in synchronism of the strobe signal.

The strobe signal output circuit receives the expected value, and according to the expected value, provides the strobe position signal suitable for the expected value to the comparison and decision circuit.

BRIEF DESCRIPTION OF THE DRAWINGS

FIG. 6 is a block diagram showing a modification of the tester of the present invention.

DETAILED DESCRIPTION OF THE EMBODIMENTS

An IC tester according to a first embodiment of the invention will be explained with reference to FIGS. 3 and 4.

Figure 1:
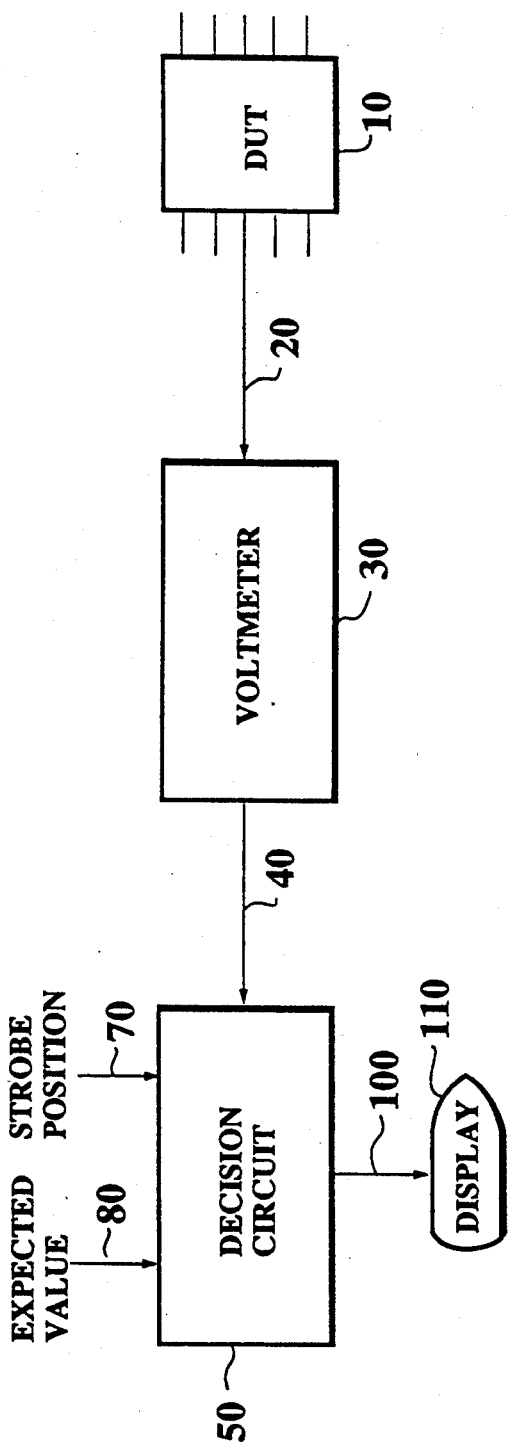
FIG. 1 is a block diagram showing a conventional IC tester.
Figure 2:
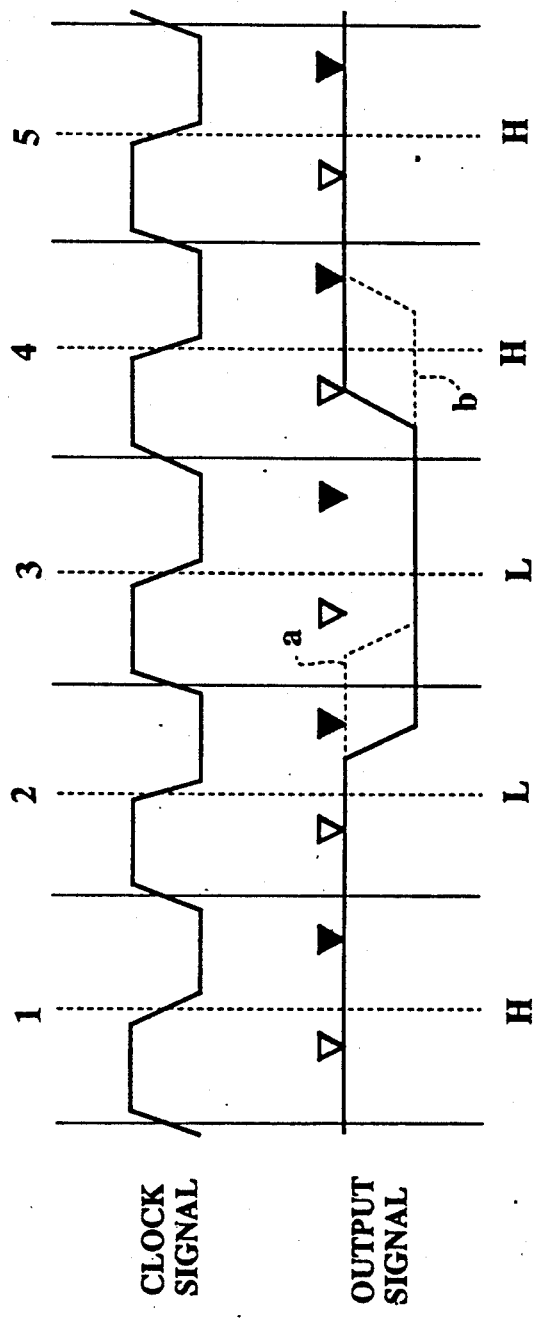
FIG. 2 is a view showing a timing for comparing an output signal of a tested IC with expected values in the tester of FIG. 1.
Figure 3:
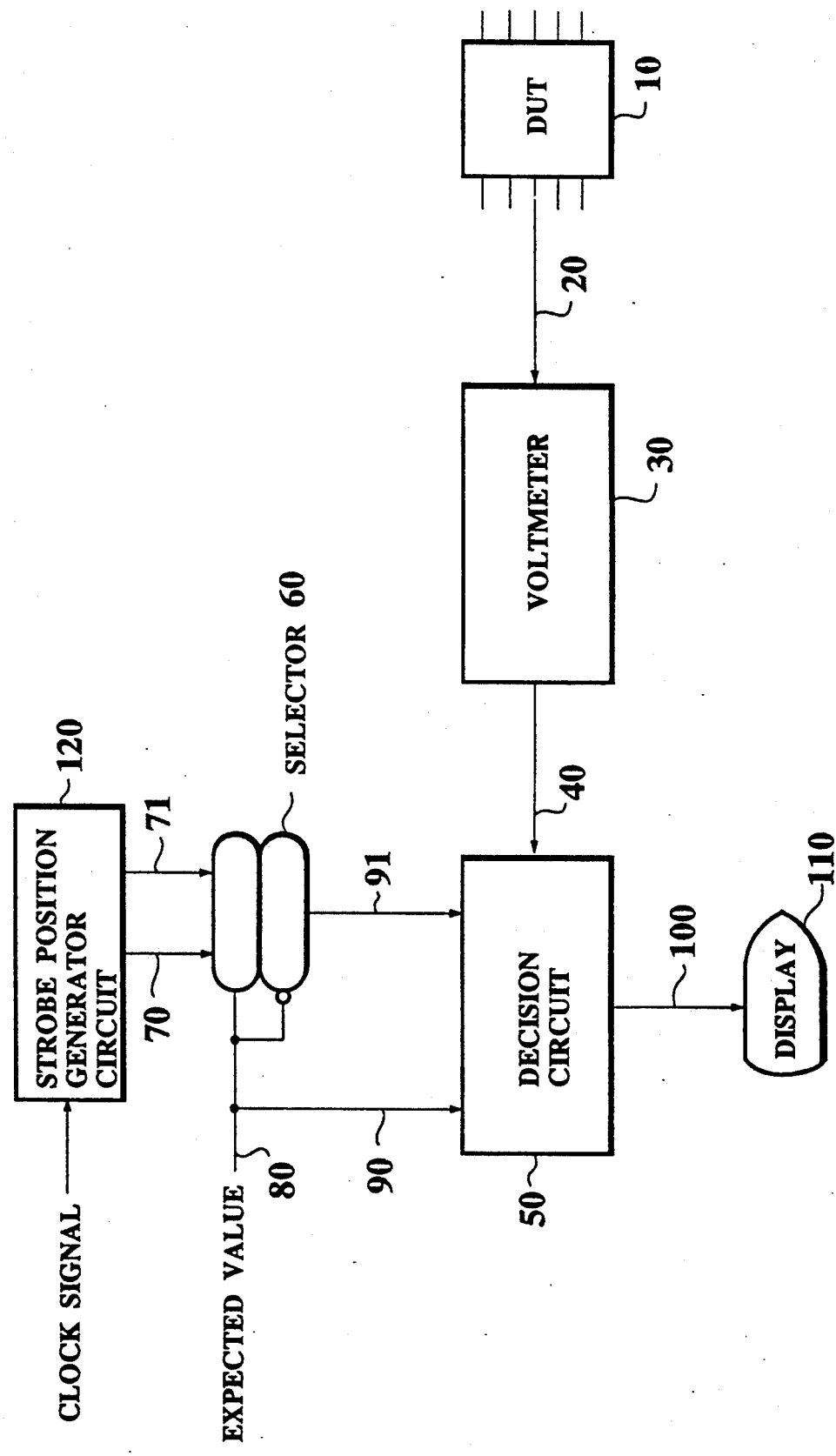
FIG. 3 is a block diagram showing an IC tester according to a first embodiment of the present invention.

In FIG. 3, the IC tester of the invention comprises, in addition to the circuit elements of FIG. 1, signal line 70 for transferring a signal indicating a strobe position for a rise of a signal (the position indicated with the white triangle in FIG. 2), a signal line 71 for transferring a signal, indicating a strobe position for a fall of the signal (the position indicated with the black triangle in FIG. 2), a selector 60 for selecting one of the signals transferred through the signal lines 70 and 71 according to an expected value, and a signal line 91 for transferring the strobe signal selected by the selector 60. The strobe position signals transferred through the signal lines 70 and 71 are provided by a strobe position generator circuit 120 according to a clock signal.

Figure 4:
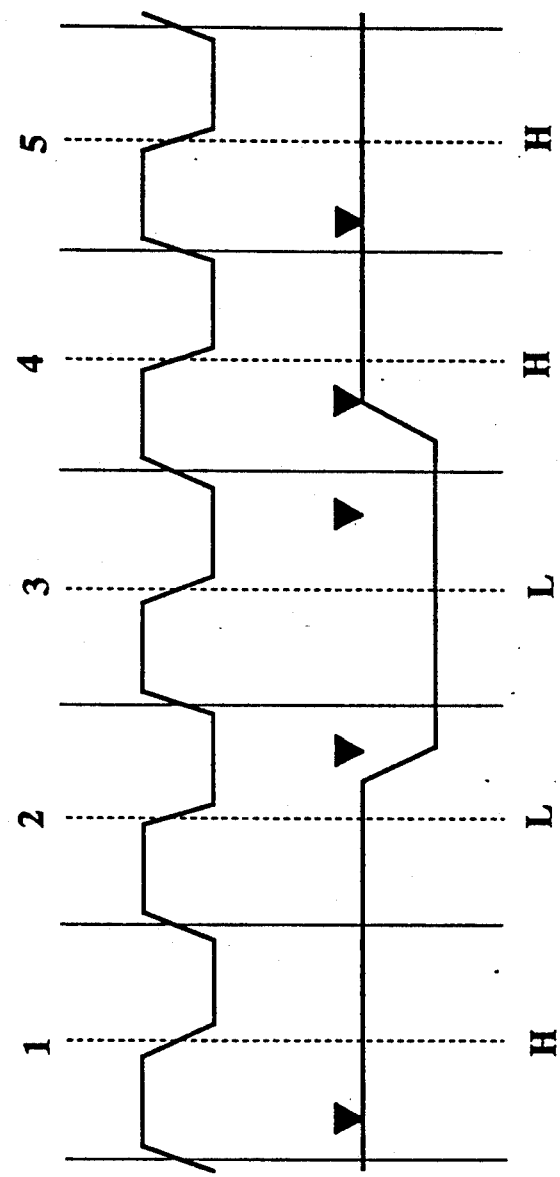
FIG. 4 is a view showing a timing for comparing an output signal of a tested IC with expected values in the first embodiment of the present invention.

A timing chart of FIG. 4 of the embodiment corresponds to the timing chart of FIG. 2 of the prior art. An operation of the embodiment will be explained with reference to FIGS. 3 and 4.

An output of the DUT 10 is supplied to the voltmeter 30 through the signal line 20. The voltmeter 30 measures the voltage of the output of the DUT 10, and provides the measured result to the decision circuit 50 through the signal line 40. These processes are the same as those of the prior art explained before.

In a second period of the clock signal of FIG. 4, an expected value is low (for example, 0 V), so that the selector 60 selects a strobe position for the low level and provides the selected strobe position to the decision circuit 50. This selected position corresponds to a black triangle in the second period of the clock signal. The decision circuit 50 receives the output of the voltmeter 30, the selected strobe position, and the expected value and voltage information corresponding to the expected value through the signal line 90. Since the DUT 10 is correctly providing the low level in the second period of the clock signal, the indicator 110 indicates a pass.

In a fourth period of the clock signal, and expected value is a high level (for example, 5 V), so that the selector 60 selects a strobe position for the high level, and provides the selected strobe position to the decision circuit 50. Since the DUT 10 is correctly providing the high level in the fourth period of the clock signal, the indicator 110 indicates a pass.

The selector 60 and strobe position generator circuit 120 form a strobe position signal output circuit for providing a proper strobe position signal according to the clock signal and expected value.

Figure 5:
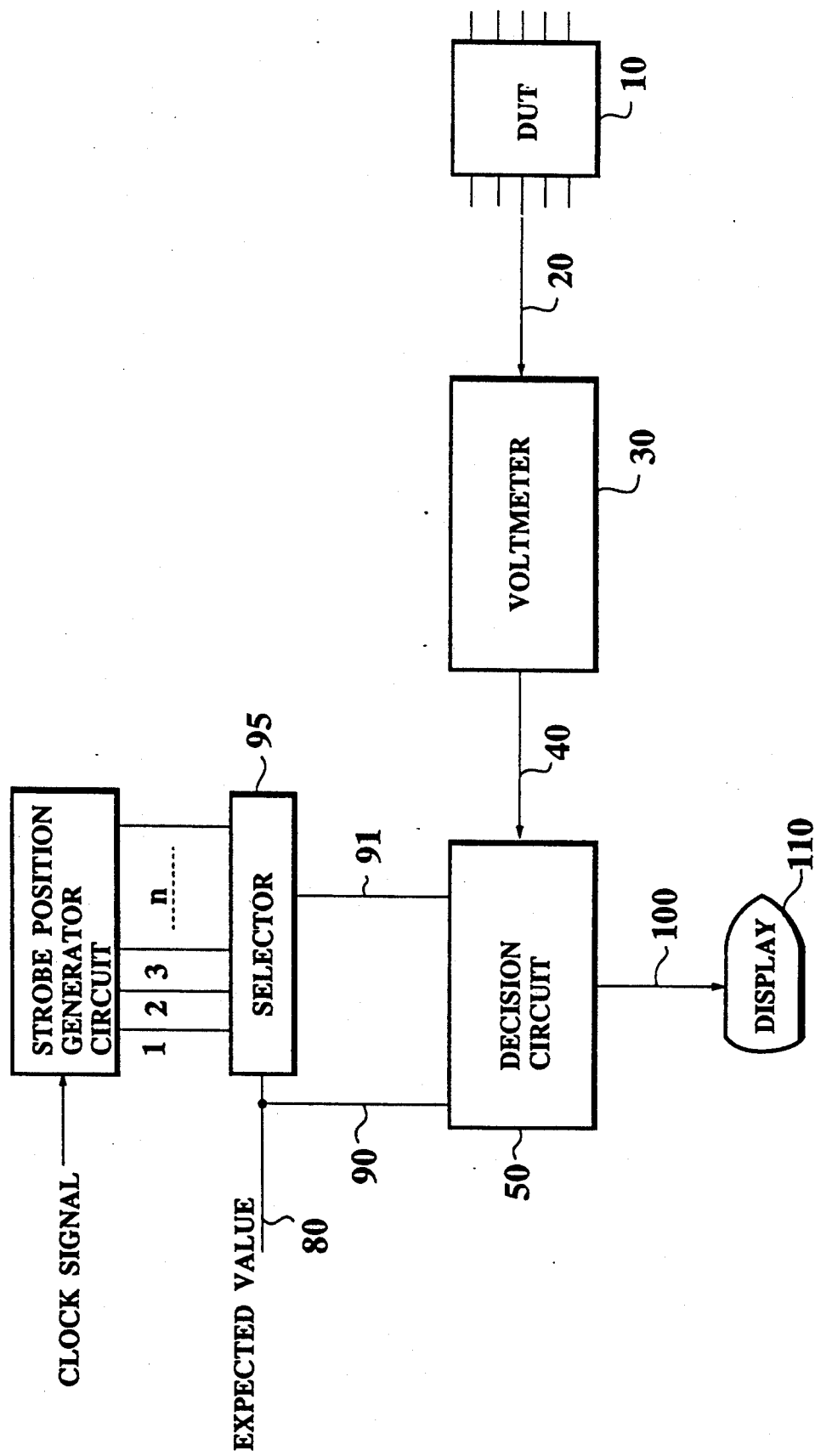
FIG. 5 is a block diagram showing an IC tester according to a second embodiment of the present invention.

The above embodiment handles two-value data. The invention is also capable of handling three-value data, or n-value data as shown in FIG. 5. In FIG. 5, a selector 95 receives "n" strobe position signals, selects one of them according to one of "n" expected values, and provides the selected strobe position signal to the decision circuit 50.

FIG. 6 is a modification of the present invention. Instead of the voltmeter 30 and signal line 40 of FIG. 3, the modification of FIG. 6 employs a reference voltage generator 200, a comparator group 220, signal lines 210 and 211 for providing the comparator group 220 with reference voltages generated by the reference voltage generator 200, and signal lines 230 for transferring comparison results of the comparator group 220 to the decision circuit 50. The decision circuit 50 determines whether or not an output signal from the DUT 10 is correct according to the output patterns of the comparator group 220. The reference voltages given to the comparator group 220 through the signal lines 210 and 211 are, for example, 4 V and 6 V for an expected value of high level, and $-1$ V and 1 V for an expected value of low level. If an output signal of the DUT 10 is between the two voltages for high or low levels, the output signal is determined to be equal to the expected value.

An operation of the modification of FIG. 6 is basically the same as that of FIG. 3. In FIG. 6 voltage information corresponding to an expected value is supplied to the voltage generator 200, and the comparator group 220 compares reference voltages supplied from the voltage generator 200 with an output signal of the DUT 10. The number of comparators of the comparator group 220 may be three or more, if necessary.

The modification of FIG. 6 is of an analog comparison technique, while the embodiment of FIG. 3 is of a digital comparison technique. Generally, the analog comparison technique achieves a higher processing speed than the digital comparison technique.

In summary, when testing an IC whose output signal rises and falls at different timing, the present invention employs different strobe positions for the rise and fall of the output signal, thereby greatly improving the efficiency of the test.

Various modifications will become possible for those skilled in the art after receiving the teachings of the present disclosure without departing from the scope thereof.

What is claimed is:

1. An integrated circuit (IC) tester for testing an IC comprising:
   a strobe signal output circuit for providing a strobe signal; and
   a comparison and decision circuit, receiving an output signal of said IC, a predetermined reference signal, and the strobe signal from said strobe signal output circuit, and comparing said output signal with said predetermined reference signal in synchronism with the strobe signal,
   said strobe signal output circuit receiving said predetermined reference signal and changing the strobe signal in response to said predetermined reference signal.

2. The IC tester according to claim 1, wherein said comparison and decision circuit includes a voltmeter for measuring a voltage of the output signal of the IC, and a circuit for comparing an output of the voltmeter with the predetermined reference signal.

3. The IC tester according to claim 1, further comprising means connected to said comparison and decision circuit, for indicating a resultant output of said comparison and decision circuit.

4. The IC tester according to claim 1, wherein said comparison and decision circuit includes a circuit for generating two reference voltages according to the expected value, two comparator circuits for comparing the output signal of the tested IC with the reference voltages, respectively, and a circuit for receiving outputs of the two comparator circuits and determining whether or not the output signal of the tested IC agrees with the expected value.

5. The IC tester according to claim 1, wherein said strobe signal output circuit includes a strobe position generator circuit for generating, according to a clock signal, a plurality of strobe position signals that are temporally delayed from one another, and a selector for selecting one of the strobe position signals according to the expected value and providing the selected strobe position signal as the strobe signal.

6. The IC tester according to claim 5, wherein the expected value is one of a high level value and a low level value, and the strobe position generator circuit provides the selector with a strobe position suitable for the high level value as well as a strobe position suitable for the low level value.

7. An apparatus for testing an IC comprising:
- a strobe position generator circuit generating a plurality of strobe signals indicating a value of a clock signal at a corresponding plurality of sample times within a clock period;
- a selector, receiving said plurality of strobe signals and a predetermined reference signal, and outputting a selected strobe signal; and
- a comparison and decision circuit, receiving an output signal of said IC, said predetermined reference signal and said selected strobe signal, comparing said IC output signal with said predetermined reference signal in synchronism with said selected strobe signal, and outputting a signal representative of said comparison.

* * * * *